(12) United States Patent
Mukherjee et al.

(10) Patent No.: US 7,043,712 B2
(45) Date of Patent: May 9, 2006

(54) METHOD FOR ADAPTIVE SEGMENT REFINEMENT IN OPTICAL PROXIMITY CORRECTION

(75) Inventors: Maharaj Mukherjee, Wappingers Falls, NY (US); Zachary Baum, Gardiner, NY (US); Mark A. Lavin, Katonah, NY (US); Donald J. Samuels, Silverthorne, CO (US); Rama N. Singh, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 10/605,102

(22) Filed: Sep. 9, 2003

(65) Prior Publication Data

US 2005/0055658 A1    Mar. 10, 2005

(51) Int. Cl.
*G06F 17/50* (2006.01)

(52) U.S. Cl. ...................................................... 716/19
(58) Field of Classification Search ............. 716/19–21
See application file for complete search history.

(56) References Cited

U.S. PATENT DOCUMENTS

| | | | |
|---|---|---|---|
| 6,042,257 A * | 3/2000 | Tsudaka ..................... | 700/121 |
| 6,174,630 B1 | 1/2001 | Petranovic et al. | |
| 6,175,953 B1 | 1/2001 | Scepanovic et al. | |
| 6,289,499 B1 | 9/2001 | Rieger et al. | |
| 6,301,697 B1 | 10/2001 | Cobb | |
| 6,373,975 B1 | 4/2002 | Bula et al. | |
| 6,453,457 B1 * | 9/2002 | Pierrat et al. .................. | 716/19 |
| 6,532,586 B1 | 3/2003 | Negoro | |
| 6,721,938 B1 * | 4/2004 | Pierrat et al. .................. | 716/19 |
| 6,918,104 B1 * | 7/2005 | Pierrat et al. .................. | 716/19 |
| 2002/0188924 A1 * | 12/2002 | Pierrat et al. .................. | 716/19 |
| 2003/0097647 A1 * | 5/2003 | Pierrat et al. .................. | 716/19 |
| 2003/0110460 A1 * | 6/2003 | Pierrat et al. ................... | 716/4 |
| 2003/0110465 A1 * | 6/2003 | Zhang .......................... | 716/19 |
| 2003/0121021 A1 * | 6/2003 | Liu et al. ...................... | 716/19 |
| 2004/0181770 A1 * | 9/2004 | Zhang .......................... | 716/19 |
| 2004/0205688 A1 * | 10/2004 | Pierrat ......................... | 716/21 |
| 2004/0219436 A1 * | 11/2004 | Zhang ............................ | 430/5 |

* cited by examiner

*Primary Examiner*—Stacy A. Whitmore
(74) *Attorney, Agent, or Firm*—Todd M.C. Li

(57) ABSTRACT

A method of designing lithographic masks is provided where mask segments used in a model-based optical proximity correction (MBOPC) scheme are adaptively refined based on local image information, such as image intensity, gradient and curvature. The values of intensity, gradient and curvature are evaluated locally at predetermined evaluation points associated with each segment. An estimate of the image intensity between the local evaluation points is preferably obtained by curve fitting based only on values at the evaluation points. The decision to refine a segment is based on the deviation of the simulated image threshold contour from the target image threshold contour. The output mask layout will provide an image having improved fit to the target image, without a significant increase in computation cost.

20 Claims, 21 Drawing Sheets

Output Mask Layout

METHOD FOR ADAPTIVE SEGMENT REFINEMENT IN OPTICAL PROXIMITY CORRECTION

BACKGROUND OF INVENTION

The present invention relates in general to lithographic processes and, more particularly, to a method for correcting a mask layout of an integrated circuit for lithographic processing effects.

The advent of advanced lithographic techniques and the attempt of chip manufacturers to closely follow Moore's law predicting an exponential growth of number of components on a chip and their shrinkage on the wafer is making the process of designing tools for automating the chip design extremely challenging. The chip is imprinted by means of optical lithographic techniques on the silicon wafer by way of chrome on glassmasks. As the components on the chip become smaller, they are now in the verge of reaching the limits of capacity of the lithographic process.

One of the most common problem of printing integrated circuits on silicon wafers from the mask using lithographic processing is the loss of fidelity of the mask shapes. The dimensions of the wafer shapes are usually much smaller than the wavelength of light that is used in the lithographic processing. The non-linearities associated with this lithographic process of imprinting and the laws of physics associated with light (including diffraction of light waves) makes impressing highly unpredictable. For instance, rectangles are foreshortened into elliptical-shapes, right angles are rounded, and the width of the shapes shrinks. In addition to the non-linearity associated with the optical effects, the process of developing after exposing the wafer and the photoactive material (i.e. photoresist, equivalently referred to as resist) thereon also adds to the uncertainty associated with the critical dimensions of the features. Other effects mainly related to the exposure and development effect associated with the resist exist that contribute to the distortions. The wafer shapes get deformed due the diffraction and scattering of light and other related optical and chemical effects of photo-resist materials. The combination of these lithographic processing effects are known as optical proximity effects.

To counter the problem of optical proximity, and increase the fidelity of the wafer printing, mask designers take into account the deformities introduced by the aforementioned lithographic processing effects by intentionally and systematically distorting the original shapes on the mask. The net result of these distortions is that the imprinted shape on the wafer ultimately looks like the target or intended images, satisfying the design rules that were created to achieve the desired yield in chip manufacturing. These methods are generally referred to as optical proximity corrections (OPC) and can be categorized into three classes:

Ad-hoc Method: This method is almost as old as manufacturing VLSI chips. Early designers modified existing methods by putting "flares" and "hammer heads" at the end of lines and "serifs" at the rectangular corners to compensate for the "line-end shortening" and "corner-rounding" due to process irregularities. Since at the early stages in the history of chip manufacturing, the size of the features was still large compared to the wavelength of the light used in the lithographic process, optical proximity effects did not contribute significantly to the total error budget of chip manufacturing. However, as the size of the features have continued to shrink, mask designers have continuously readapted earlier techniques to obtain the desired results. Therefore, though prevalent in the early part of the history of optical proximity effect corrections, there has not been any significant development of these so-called ad-hoc methods.

Rules-Based Method: The rules-based method is an initial attempt to formalize the above ad-hoc method. It was observed by chip designers that any compensation required by a particular shape on the wafer was dependent on neighboring shapes, e.g., an isolated line requires more compensation than a set of dense lines. The rules-based method formalizes this notion in a more quantitative way. For example, a chip designer may use a set of empirically-derived rules to decide what the dimensions of a "hammerhead" are to be added to compensate for line-end shortening or what "corner-serifs" would compensate for corner-rounding. These dimensions can be applied as a function of certain rules as, for instance, those that depend on the particular shape to which it is applied, the distance to the neighbors, and the dimensions of the neighbors. However, the rules are still applied heuristically, and can still lead to inaccurate imaging relative to the desired target image, even when implemented in a computer program.

Model-Based Method: This method, also known as model-based OPC (MBOPC), emulates the physical and optical effects that are mostly responsible for shape deformations. At the heart of these methods is a computer simulation program that, given the appropriate optical and physical parameters and the original dimension of the object on the mask, predicts, with a certain degree of accuracy, the printed dimension of the object on the wafer. In the correction phase of the model-based optical proximity correction (MBOPC), the shape on the mask is iteratively modified so that the resulting output closely approximates what is desired for the image or imprinted shape on the wafer. This method automatically deforms existing mask shapes to achieve the target dimensions on the wafer.

The success of model-based OPC depends on a very accurate simulator that would predict the lithographic processing effects. The simulator predicts the lithographic effect corresponding to selected points on the mask. Based on the simulation, an integrated circuit layout modeler can determine the printed image on the wafer by interpolating selected simulated points. The modeler may also correct the mask shape by modifying the edge segments on the mask based on the simulation done at representative points of a mask segment, typically on the center point of the edge segment. The simulation of the image at points on the mask is computationally very expensive. Therefore, the modeler usually relies on doing the simulation only at certain pre-determined or preselected evaluation points. The preselection is done by segmenting the edges of the mask shapes by using certain pre-specified rules.

The preselection of points often make the nature of simulation as a whole unreliable and untrustworthy. This is because often the detailed variations of the wafer image cannot be characterized by simple interpolation of these simulated images done at the preselected evaluation points. The simulation at the preselected segment points often has the problem that more points of simulation than necessary are provided where there is little image variation at the wafer, while having too few points of simulation where there are large image variations.

The current state of the art is shown in FIG. 1. In the current state of the art, the input is a mask layout (101) that is intended to project a desired target image 106. An example of an input mask layout 101 is shown in FIG. 1A. The mask shapes are segmented at a preprocessing stage (Block 102), resulting in segmented mask shapes 103. The resulting mask segmented mask shapes 103 is similar to that illustrated in FIG. 1B. This stage precedes any image simulation (Block 104). After the edges are segmented, the image intensity is simulated typically at a predefined point within each segment only (Block 104). The image at that predefined point of the segment is then compared (Block 105) with the corresponding points of the target image 106. (An example of a target image 106 is shown in FIG. 1C.) If the difference of image intensity at the predefined point of the segments and the corresponding points of the target image 106 is greater than the specified tolerance, segments of the mask are moved away or towards the target shape 106 to compensate for the difference (Block 107). This process is repeated until all the intensity values at the predefined evaluation points of all the segments are within the specified tolerance. At the end the output mask layout 108 is produced. For clarity, the initial mask shapes 101 are illustrated to be the same as the target shapes 106. Initially, the mask shapes 101 may be the same as the target shapes 106. However, after a few OPC iterations (e.g., Blocks 104, 105 and 107), the output mask shapes 108 become different from the target shapes 106. An example of the output mask shape 108 is illustrated in FIG. 1D.

To accelerate the process of convergence during the iterative optical correction process, as described above, the amount of movement of the mask segments at each iteration is controlled by the gradient and curvature of the image intensity profile at the vicinity of the above mentioned predefined evaluation point for each segment. For a given value of intensity I(x, y) at a point (x, y) on the wafer, the gradient and the curvature is defined as follows:

The gradient is defined as (1)

$$\sqrt{\left(\frac{dI(x, y)}{dx}\right)^2 + \left(\frac{dI(x, y)}{dy}\right)^2}$$

where I(x, y) is the image intensity at the predefined point, and where, in this example, the x-direction extends along the directions of segments A and B, and the y-direction is the direction orthogonal to the segments. In order to compute the gradient accurately, a finite difference method is used in the current state of the art tools. In this method, in addition to the computation of the image intensity at the selected point, image intensities at a few more points are also computed. An example of this approach is shown in FIG. 1E. In FIG. 1E, a segmented layout is shown (103). One of the segments (153) has end-points 151 and 152, respectively. The image intensity, as explained above is computed at a predefined evaluation point 160 (preferably the center) for segment 153. The image computed at the preselected evaluation point 160 is assumed to be representative of the segment 153. In addition to the image intensity computed at the predetermined evaluation point 160, the image intensities are computed at a few more points in the vicinity of the evaluation point 160. Referring to FIG. 1E, the region of vicinity is marked by a square box 155 centered around the evaluation point 160 with edges parallel to the x and the y axis (note that for the sake simplicity, it is assumed that the edge 153 is parallel to the x axis). The size of the box 155 is very small compared to the length of the segment 153. For example, if the length 171 of the segment 153 is about 100 nanometers, then the length 170 of a side of the square box 155 (i.e. the vicinity of the evaluation point 160) can be as small as 2 nanometers. The image intensity at the given (predefined) evaluation point 160 is defined as I0. The image intensities of two more points one immediately above and another immediately below (points 161 and 162, respectively) are defined as I1 and I2, respectively. Similarly, the image intensities of two more points one immediately to the right and another immediately to the left of 160 (points 163 and 164, respectively) are defined as I3 and I4, respectively. The distance between the points above and below the given point (along the y-axis) are defined as $\Delta y$, and the distance between the points left and right of the given point (along the x-axis) is defined as $\Delta x$. Then the gradient is approximated as:

$$\sqrt{\left(\frac{I1 - I2}{\Delta y}\right)^2 + \left(\frac{I3 - I4}{\Delta x}\right)^2}. \quad (2)$$

The curvature is defined as:

$$\sqrt{\left(\frac{d^2 I(x, y)}{dx^2}\right)^2 + \left(\frac{d^2 I(x, y)}{dy^2}\right)^2} \quad (3)$$

The curvature can also be computed by a similar finite difference computation with a few more extra points, as would be understood by one skilled in the art.

In order to compute the curvature one need to consider points 165, 166, 167, 168 around the point 160 in the box 155, along with the points 161, 162, 163, 164 as previously considered for computing the gradient. The image intensities at these four points are computed as I5, I6, I7, I8, respectively. In this case the curvature may be computed as:

$$\sqrt{\left(\frac{(|I7 - I8|) - (|I6 - I5|)}{\Delta x^2}\right)^2 + \left(\frac{(|I5 - I8|) - (|I6 - I7|)}{\Delta y^2}\right)^2} \quad (4)$$

Note that the above expression in Equation (4) is only one way of approximating the curvature by a finite difference method. Other methods may be used to approximate the curvature. For example, a simpler but less accurate method of computation of gradient using only the aforementioned five points 160 through 164 would be as given in the following equation $$\sqrt{\left(\frac{(|I1 - I0|) - (|I0 - I2|)}{(\Delta y/2)^2}\right)^2 + \left(\frac{(|I3 - I0|) - (|I0 - I4|)}{(\Delta x/2)^2}\right)^2} \quad (5)$$

In a practical simulator the value of $\Delta x$ and $\Delta y$ is on the order of a few nanometers. It should be noted that the values of gradient and curvature are computed in current state of the art methods and are thus available for use in the context of the present inventive method and will not require any additional computation for the gradient and curvature to implement the present inventive method.

The problem with the current method is demonstrated in FIGS. 2 through 5. FIG. 2A shows a target image 200 and an input mask shape 201 (which initially has the same shape as the target image 200) and the corresponding output mask shape 208. Note that the target image shape boundary 200 represents the contour of threshold image intensity that is desired in order to print the image. Hereinafter, references to the boundary and shape of an image are used to interchangeably refer to the contour of the threshold image intensity. It also shows the corresponding simulated image 220 (that is, the contour of the aerial image at the threshold intensity required to print the image) on the wafer and then finally superimposes the wafer image 220 on the desired target image 200. The image intensity threshold level is defined by the corresponding lithographic process conditions, including, but not limited to, for example, factors such as the dose-to-clear characteristics of the resist. FIG. 2 shows a portion of a target shape 200 having (straight-edged) boundary 215, which has been divided into edge segments A (having segment boundaries 210, 212), B (having segment boundaries 212, 214), etc. Predetermined evaluation points (e.g. points 310, 320 in segments A, B respectively) are defined for each segment, which are typically chosen to be at the center of a segment. Superimposed on the target shape 200 is the corresponding (simulated) wafer image 220 having (curved-edged) boundary 225. The interior of boundary 225 of the simulated image intensity is defined as the region where the image intensity exceeds a particular threshold intensity level. The current state of the art, the image intensity is typically computed only at the center or some predefined point of the segments A, B, etc. As described above the image gradient and the curvature is also computed along with the image intensity. The OPC algorithm incrementally corrects (Block 107) the mask shapes until the simulated image 220 has a threshold intensity that matches the target image intensity at the points of the target image corresponding to the predetermined evaluation or comparison points 310, 320 of each of the mask segments (See FIG. 3). The conventional OPC correction algorithm ignores image intensities at any point that is between two preselected comparison points (e.g. points 310, 320) of adjacent target image segments. As a result of this, one can get severe deviations of the wafer image from the target image. An example of this is shown in FIG. 4.

FIG. 4 shows a target feature 400 having a straight-edged threshold boundary 410 that outlines a large shape 401 adjacent to a narrow shape 403. The simulated image 411 having a (curve-edged) threshold boundary 413 resulting from a mask generated by conventional MBOPC is superimposed on the target image boundary 410. Because of the failure of the current state of the art it creates a necking or constriction, wherein the width of the resulting image $W_f$ at the neck region 402 is less than the critical dimension (CD) of the narrow target image shape 403. Sometimes the constriction can become really narrow and pinch-off as shown at the center of the scanning electron microscope (SEM) image in FIG. 5. In FIG. 5, a wide feature 501 (analogous to the wide portion 401 of the target image in FIG. 4) and a narrow feature 503 (analogous to the narrow portion 403 of the target image in FIG. 4) should have been connected at point 502, but in fact has printed as two disconnected shapes due to excessive necking of the image. In the conventional MBOPC, the solution to this problem requires creation of smaller segments throughout the mask and target image, which will improve the accuracy of the simulation and allow the OPC model to modify the mask in the critical neck region. However, in conventional methods, the refined segmentation is performed even in portions of the mask where the resulting image does not vary rapidly (e.g. along the narrow region 213 away from the neck region 222 in FIG. 2A), which can significantly increase computation costs unnecessarily.

Therefore, there is a need for a methodology for designing masks that result in images that match target shapes accurately, but without undue computation time.

SUMMARY OF INVENTION

It is therefore an objective of the present invention to provide a method and a computer program product to perform the method, for manufacturing an integrated circuit, including designing a lithographic mask layout that results in a printed image that accurately represents a target image without significant increases in computation costs over conventional model-based optical proximity correction algorithms (MBOPC).

It is a further objective of the present invention to provide a method and computer program product for performing MBOPC in which mask segments are adaptively refined.

It is another objective of the present invention to provide a method and computer program product for adaptively refining mask segments without significantly increasing the computation costs by basing the refinement on image computations at pre-existing segment evaluation points.

A methodology is presented for a integrated circuit layout design tool to improve the accuracy and correctness of optical proximity correction. The methodology adaptively refines the segmentation of the mask shapes to improve the accuracy of the simulation. The adaptive refinement approach uses an iterative algorithm. Each step of the algorithm uses the local image gradient and image curvature to determine the deviation of the image from that predicted by the existing fragmentation. Instead of using a simulation of the exact contour it uses a curve fitting of the contour by using one or more of the parameters of the image intensity value, gradient and the curvature. If the deviation is more than a tolerable limit, it refines the existing segmentation by inserting more segments at desired locations. The methodology can be used for improved simulation of the silicon wafer containing an integrated circuit and correct the mask that is used to create the silicon wafer.

In a first aspect of the present invention, a method of manufacturing an integrated circuit, and a computer program product for performing the method, is provided in which a target design is provided, preferably expressed as a desired threshold intensity contour layout, wherein the target design shape is divided into target segments and each of the target segments has an associated segment evaluation point, providing an initial mask shape which is divided into mask segments corresponding to each of the target segments, determining a simulated image corresponding to each of the associated segment evaluation points, wherein values of the simulated image are formed in accordance with the mask shape for a given lithographic process, providing a deviation tolerance for a deviation of a simulated image metric from a corresponding target image metric, and for each of the segment evaluation points, determining a simulated image metric based on the simulated image at said segment evaluation point, and refining the mask segment corresponding to the segment evaluation point if the simulated image metric exceeds the deviation tolerance.

In another aspect of the present invention, the deviation tolerance is the defined to be the maximum distance tolerated between the threshold intensity contour of the simulated image from the target image.

In yet another aspect of the present invention, an estimated image between segment evaluation points is used to determine the deviation metric. The estimated image may be obtained by a curve fit based on the simulated image at the evaluation points, such as intensity, gradient and curvature. A curve fit may be performed by any of a Binomial spline, polygonal approximation, circular arc, cubic spline, Bezier curve, or the like.

In a further aspect of the present invention, pre-existing values of the gradient and curvature of the simulated image may be tested against a gradient and/or curvature tolerance to determine whether a segment refinement is required. If the gradient and/or curvature tolerances are not exceeded, then no further refinement of a segment is required, and no additional computation will be required.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF DRAWINGS

For a more complete understanding of the present invention, and the advantages thereof, reference is now made to the following descriptions taken in conjunction with the accompanying drawings, in which:

FIG. 1A illustrates an initial mask layout provided as input to MBOPC.

FIG. 1B illustrates a mask shape that has been segmented according to conventional MBOPC.

FIG. 1C illustrates a target image pattern provided as input to MBOPC.

FIG. 1D illustrates an output mask layout resulting from a conventional MBOPC.

FIG. 1E illustrates grid points used in a finite difference calculation in a conventional MBOPC.

DETAILED DESCRIPTION

Figure 1:
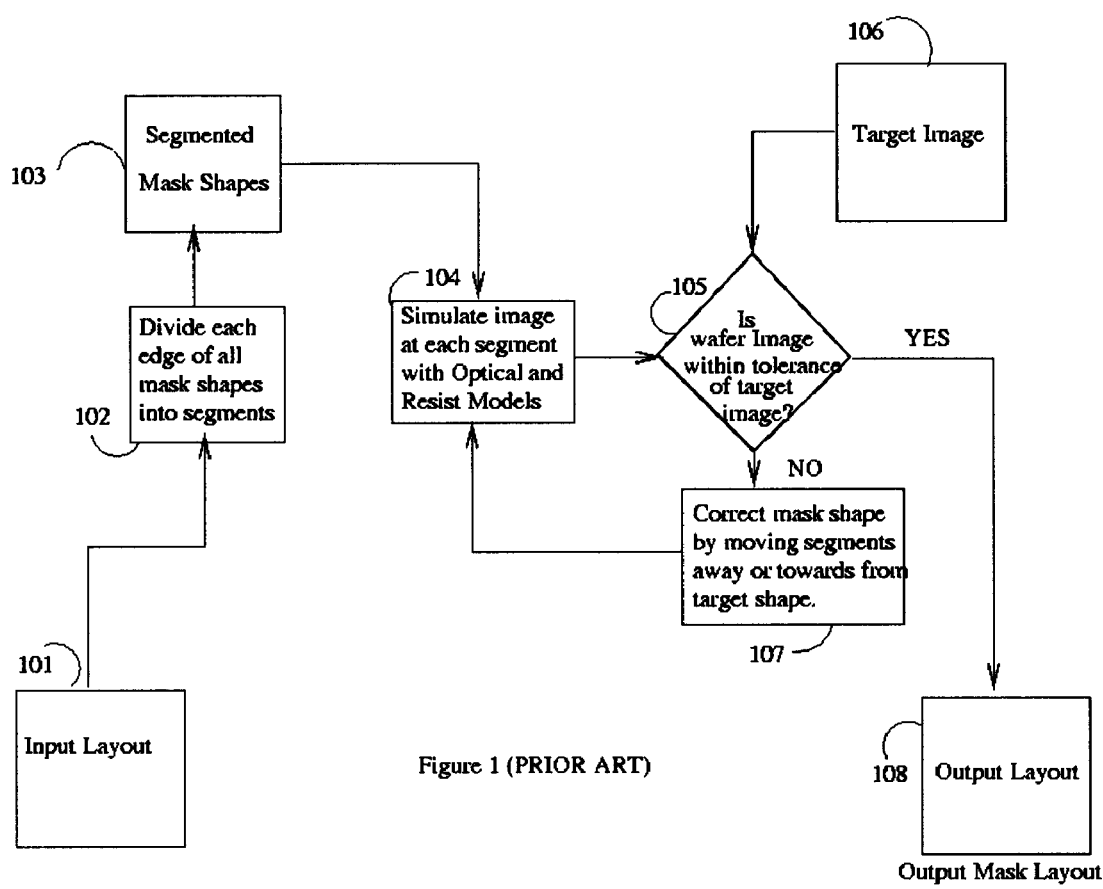
FIG. 1 illustrates a flow chart for a conventional model-based optical proximity correction (MBOPC).
Figure 1:
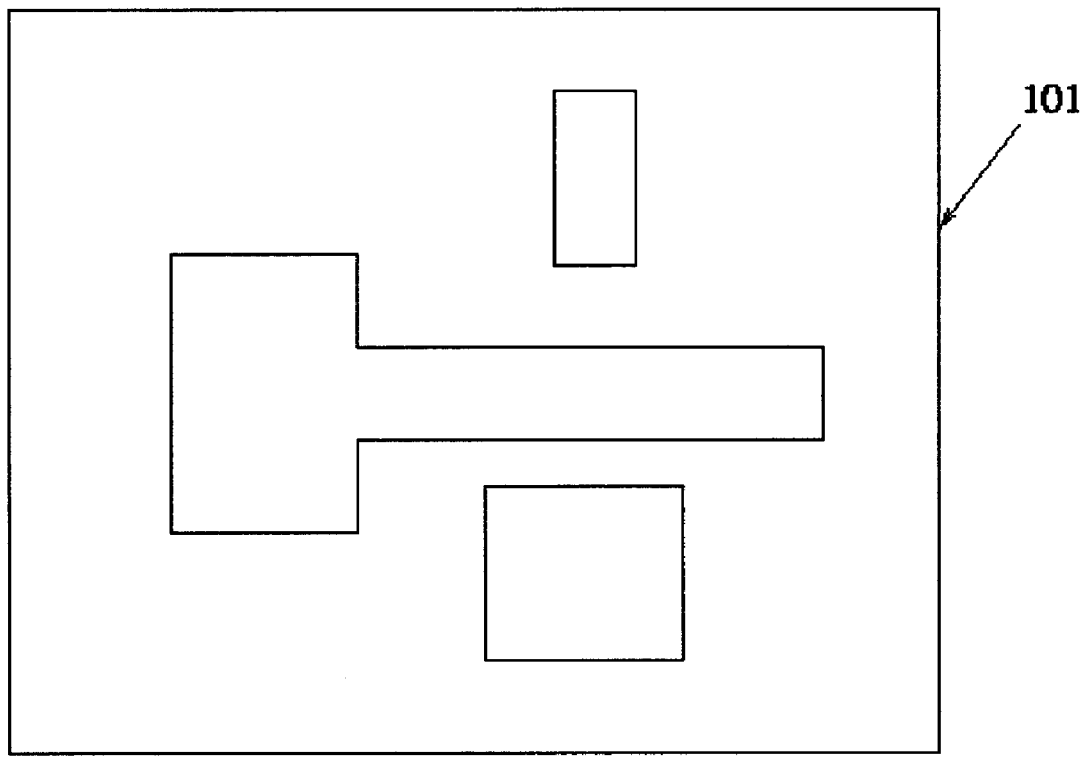
Figure 1:
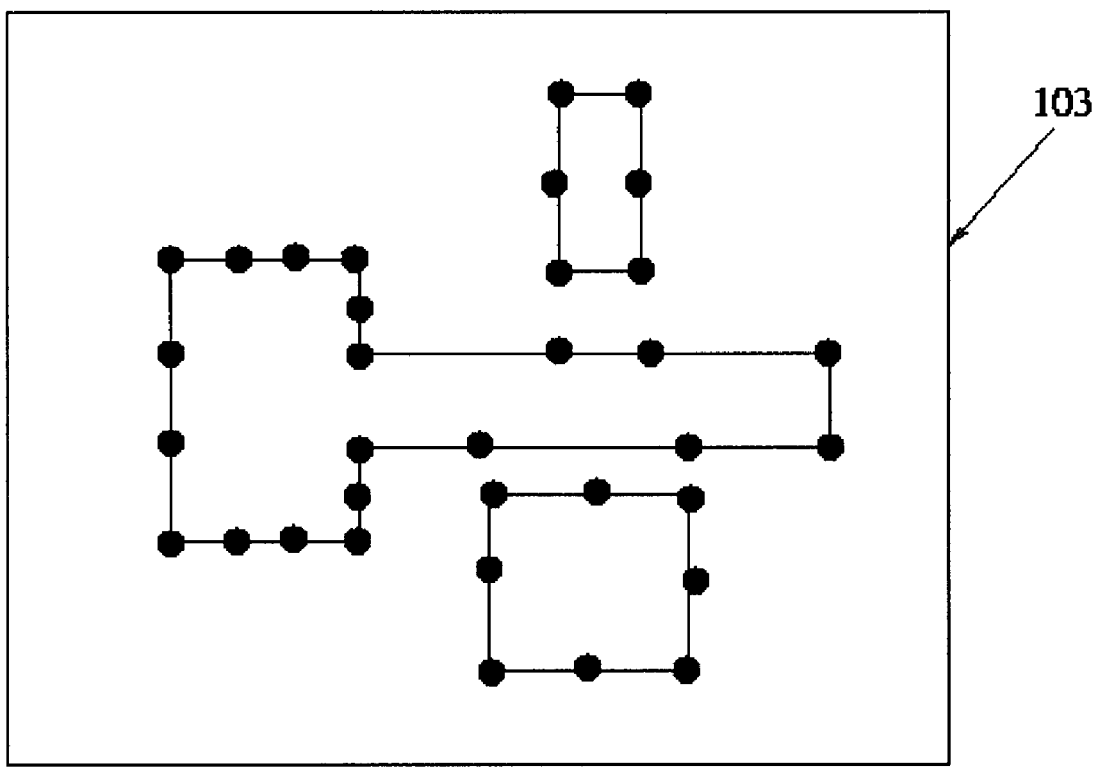
Figure 1:
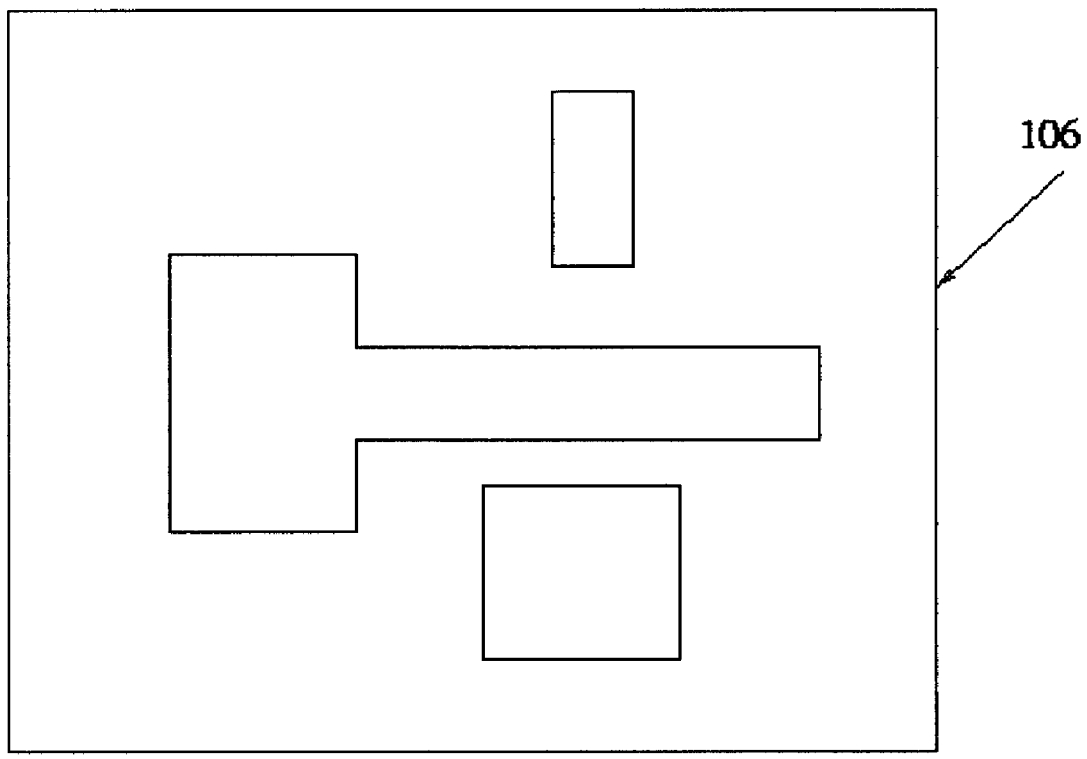
Figure 1:
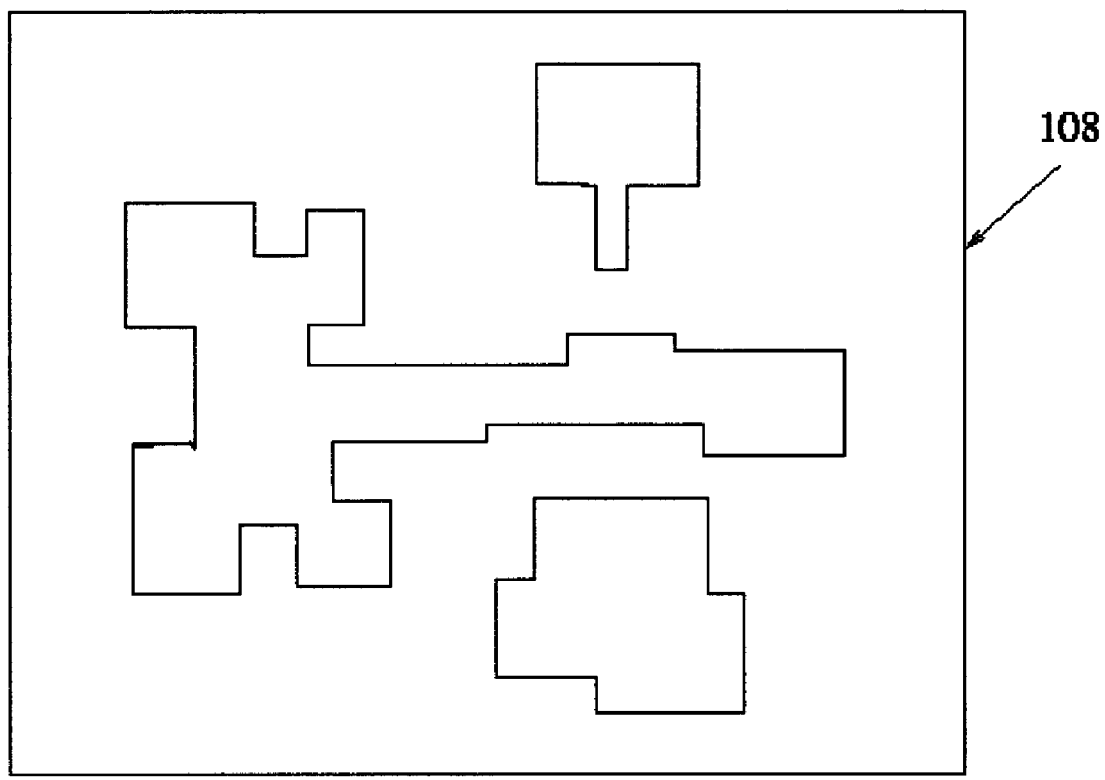
Figure 1:
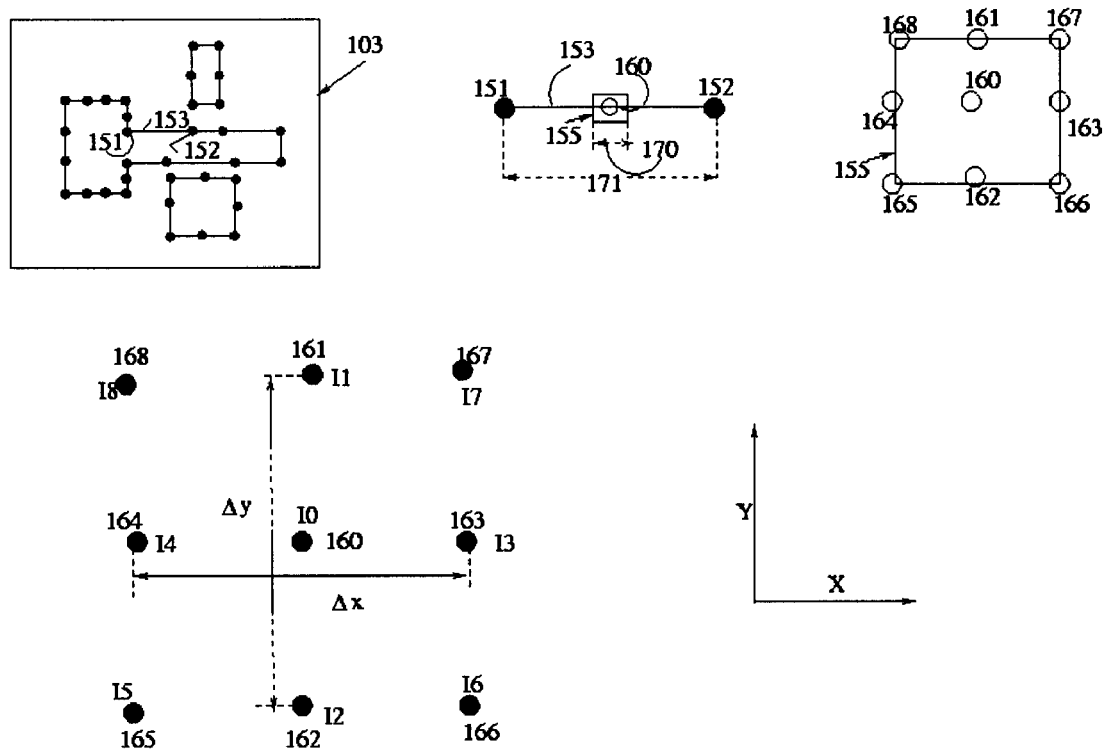
Figure 2:
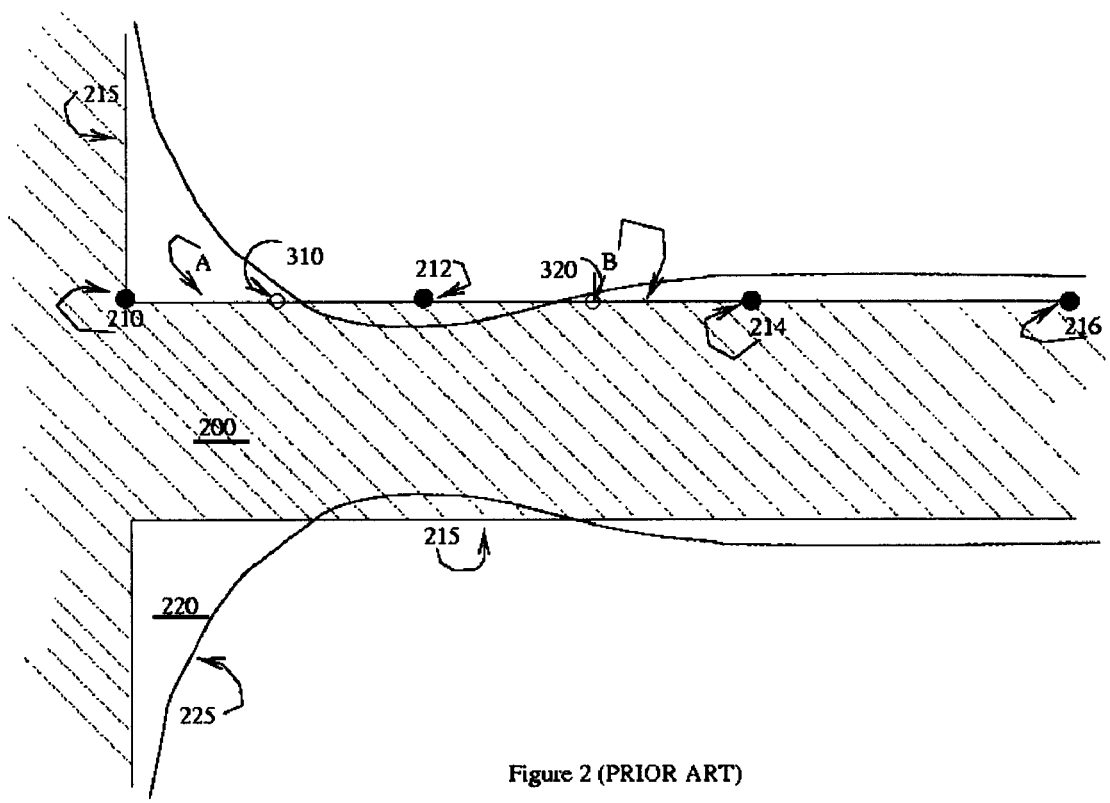
FIG. 2 illustrates a portion of a simulated wafer image superimposed on a corresponding portion of a target image having segments and predetermined evaluation points.
Figure 2A:
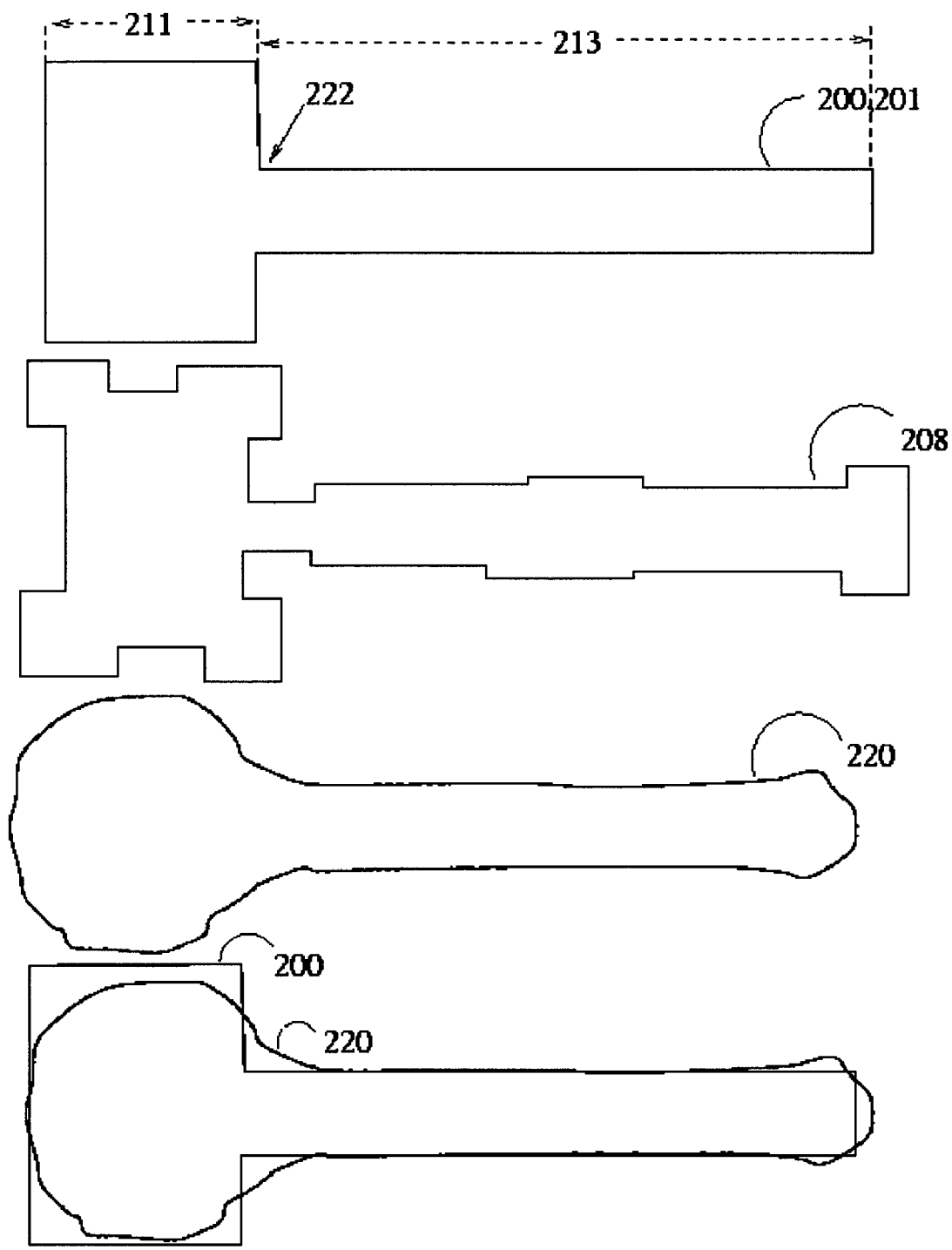
FIG. 2A illustrates an input target image and mask shape, a corresponding output mask shape, a corresponding simulated wafer image, and a superposition of the wafer image on the target image according to a conventional MBOPC.
Figure 3:
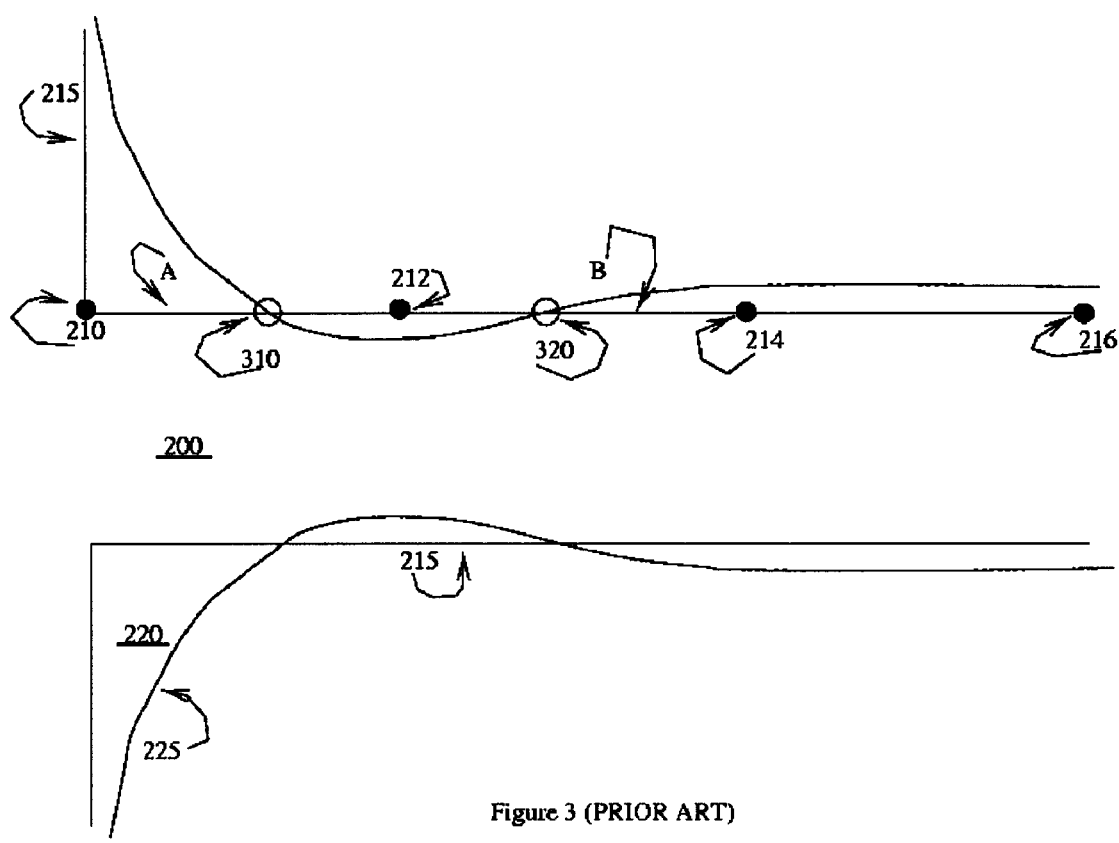
FIG. 3 illustrates a portion of a simulated wafer image superimposed on a corresponding portion of a target image having segments and predetermined evaluation points, where the image intensity matches the target image intensity at the evaluation points.
Figure 4:
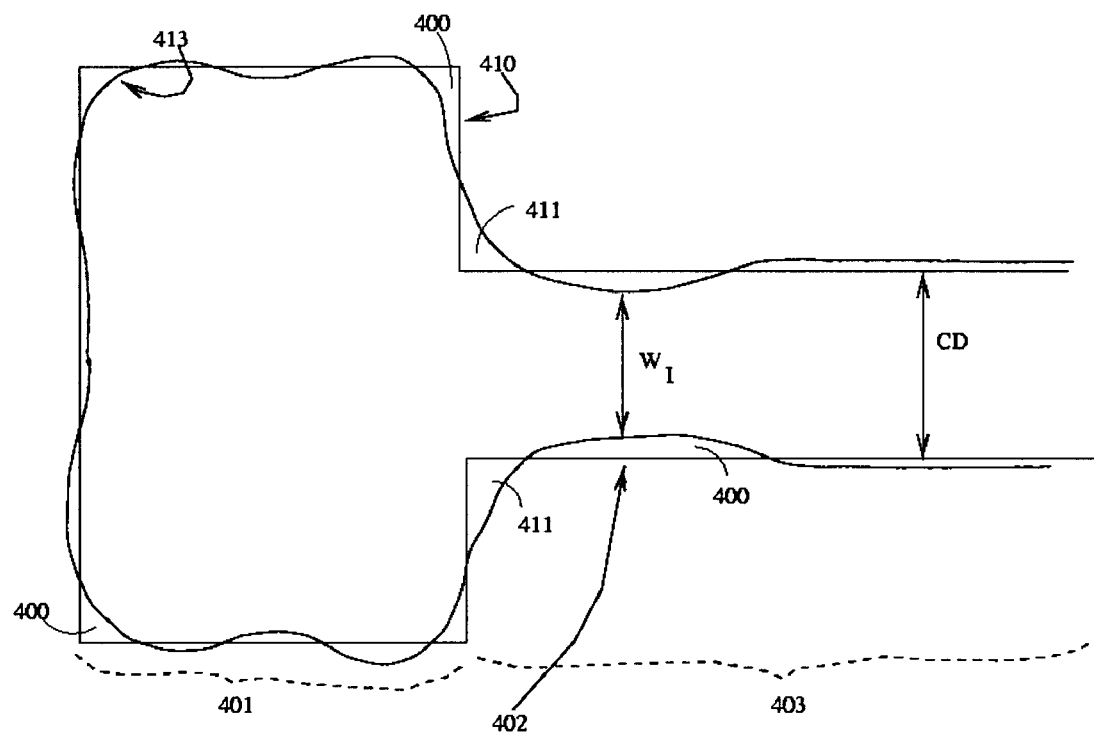
FIG. 4 illustrates a portion of a target image feature having a non-critical shape adjacent to a narrow shape having a critical dimension (CD), and a superimposed corresponding portion of a conventionally simulated wafer image superimposed on the target image, where the wafer image has a reduced width compared to the CD.
Figure 5:
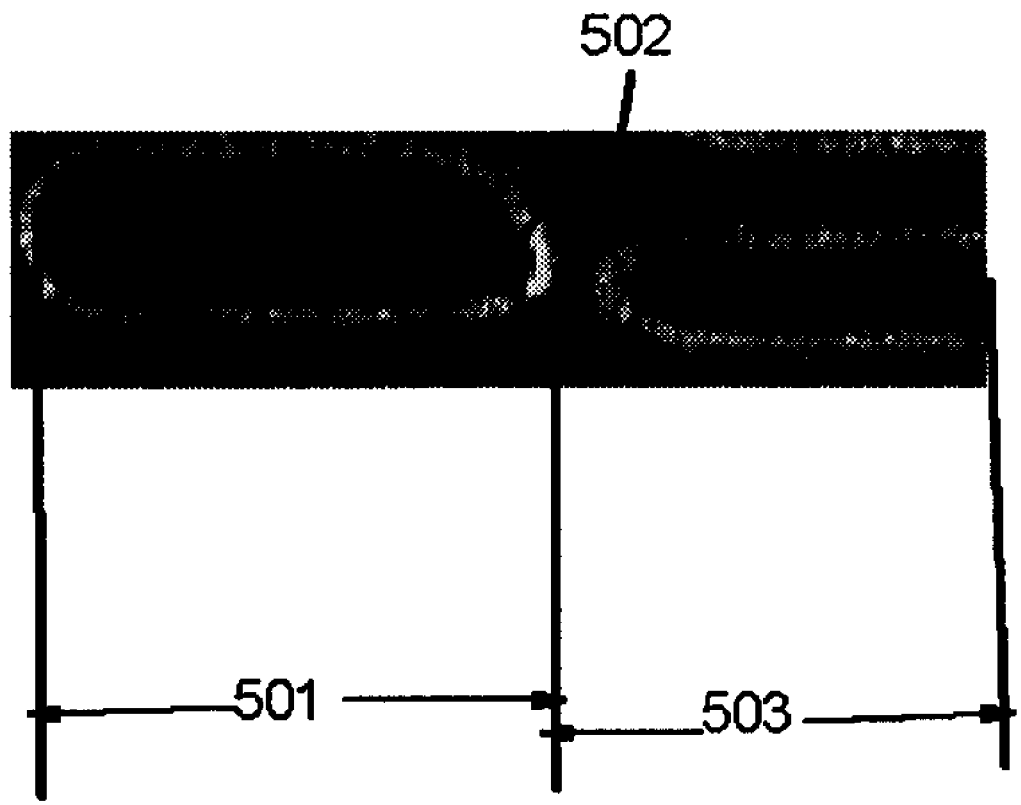
FIG. 5 shows an scanning electron microscope (SEM) image of a printed wafer image resulting from a mask layout output from a conventional MBOPC, where the wafer image has a pinched-off portion at the junction of a noncritical portion and critical portions of a target feature.

In the following description, numerous specific details may be set forth to provide a thorough understanding of the present invention. However, it will be obvious to those skilled in the art that the present invention may be practiced without such specific details.

Refer now to the drawings wherein depicted elements are not necessarily shown to scale and wherein like or similar elements are designated by the same reference numeral through the several views.

In accordance with the present invention, a method and computer system is provided for performing model-based optical proximity correction (MBOPC), wherein the comparison of simulated image to target image is performed using an adaptive refinement of segmentation that is based on the image gradient. Using this methodology, a proper balance of the segmentation can be achieved that takes into account the variations of the wafer image. This methodology can be used to obtain more accurate and faster image simulation and mask correction tools.

Figure 6:
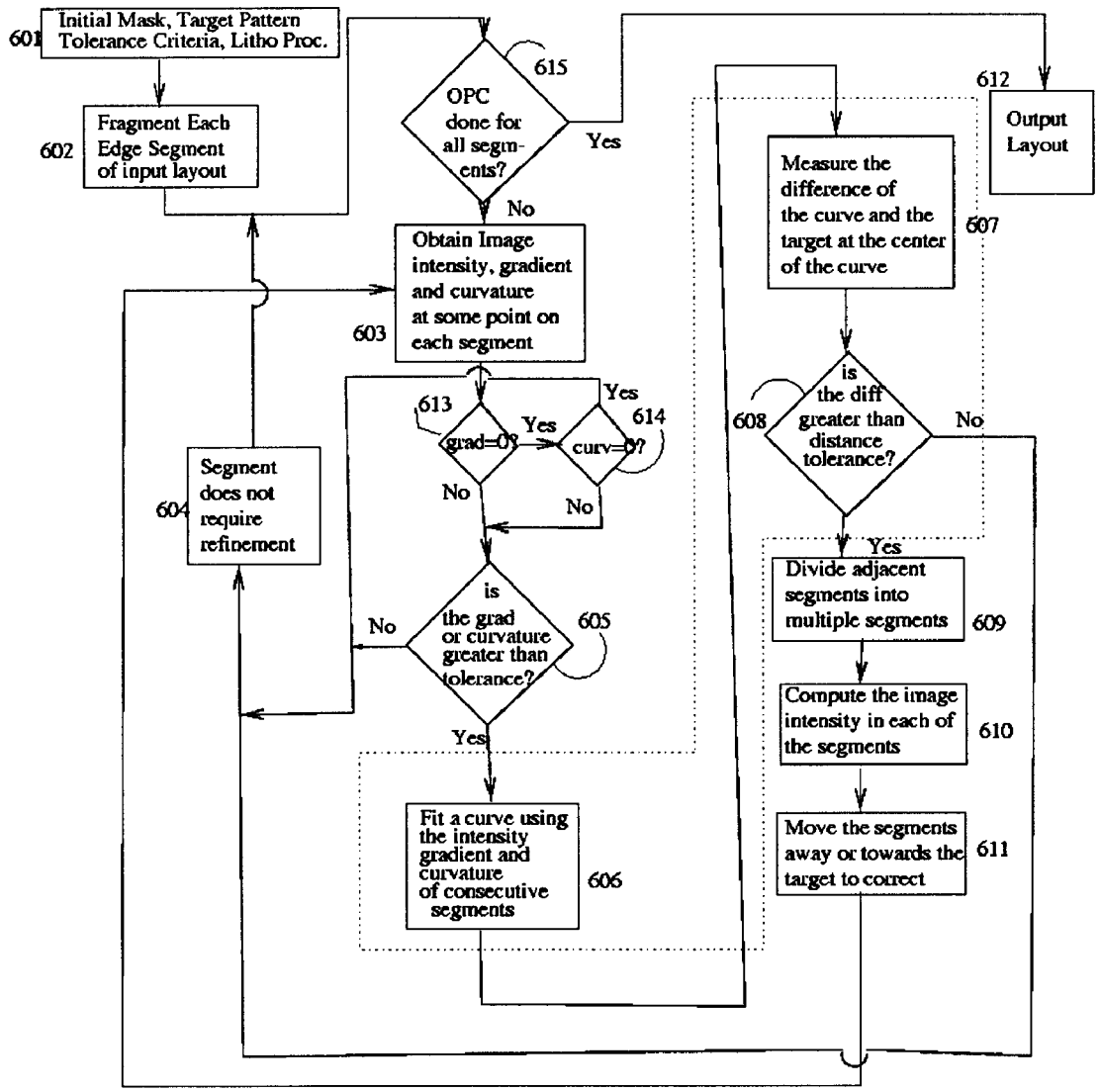
FIG. 6 illustrates a flow chart of a preferred embodiment of the present invention.

FIG. 6 shows the preferred embodiment of the present invention. At the start, an initial mask layout is first provided (Block 601). In addition, a desired target image pattern is provided, similar to the target pattern 106 of conventional MBOPC, as well as tolerance criteria, including a deviation tolerance, an image gradient tolerance and a curvature deviation tolerance. The edges of the primary mask features and the target image pattern are fragmented into edge segments as in conventional OPC algorithms (Block 602). The image projected by the mask for the target lithographic process is simulated, including image intensity, and the image gradient (and other parameters as desired, for example, the curvature) at the selected (predetermined) comparison points (e.g. typically, but not limited to, one point at the center of each segment) (Block 603). In order to compute the gradient and curvature, additional image values near the pre-determined evaluation point are typically required, for example, by computing values in a nine-point pattern around the evaluation point, which allows a finite difference approximation of the gradient and curvature, as described above (see FIG. 1E).

In accordance with the present invention, the deviation of the simulated image from the target image is estimated for regions between the predetermined evaluation points. If the estimated deviation exceeds a predetermined deviation tolerance, then a refinement of the relevant segment will be performed. The estimation of deviation is performed preferably by fitting a curve between adjacent evaluation points using the gradient and the curvature computed at the pre-determined evaluation points. The gradient and curvature may be computed in a manner similar to that described previously, and are typically provided by conventional OPC methods as previously discussed. The computed gradient of the simulated image at the pre-selected points is first compared to a gradient tolerance (Block 605). If the gradient exceeds the gradient tolerance, then this indicates that a large deviation may exist between the target image and the simulated image, and therefore, at least one segment may need to be refined. The amount and nature of segment refinement is preferably determined by performing a curve fit (Block 606), as described in more detail below. In the case that the computed gradient is zero (Block 613), it is possible that the image is at an optima (i.e. a maximum, a minimum, or a saddle point). In this case, the value of the curvature is used to determine whether a segment needs refinement. If the curvature is also zero (Block 614) the segment does not need refinement (Block 604) and the next segment is considered (Block 603). If the gradient is zero, and the curvature exceeds the curvature tolerance at the given predetermined evaluation point (Block 605), then that indicates that the segment may require refinement, and the method proceeds to estimation and evaluation of the deviation (Blocks 606–608).

The process of segment refinement is shown in Blocks 606 through 611. The first step in the process of refinement is to fit a curve using the image intensity, gradient and the curvature (the latter in case the gradient is zero) of adjacent evaluation points (Block 606). The next step is to compare the maximum deviation (i.e. distance) of the computed curve (i.e. the threshold intensity contour in the simulated image) from the target image (i.e. the threshold intensity shapes of the target image) for the corresponding segment. The curve fitting may be any method that fits a curve between two or more points, including, but not limited to, B-spline, polynomial approximation, circular arc, cubic spline and Bezier curve. If the deviation of the curve exceeds the deviation (distance) tolerance (Block 608), this indicates that the associated segment requires refinement, in accordance with the present invention.

The corresponding segment for the mask and the target is then refined (Block 609) by breaking up each of the adjacent segments into at least two segments. The newly created segments replace the original segments in the MBOPC algorithm. The image intensities are computed for these new segments (Block 610), in the same manner as in Block 603. If the image parameters (intensity, gradient and/or curvature) had been computed in a previous step and a segment has not gone through the refinement process, these values may be used in this step, without recomputing new values.

This step is comparable to the step described in Block 104 in FIG. 1. The re-computed image intensities for the new segments are compared to the target image intensities (according to the intensity tolerance) and the mask edge segments are modified accordingly (Block 611). This step is comparable to the step described in Block 107 in FIG. 1. The evaluation of each mask and image segment is continued until no more segments require refinement (Block 604) and then the output mask layout is generated (Block 612). FIG. 6 can be implemented on a digital computer as shown in FIG. 12.

Figure 12:
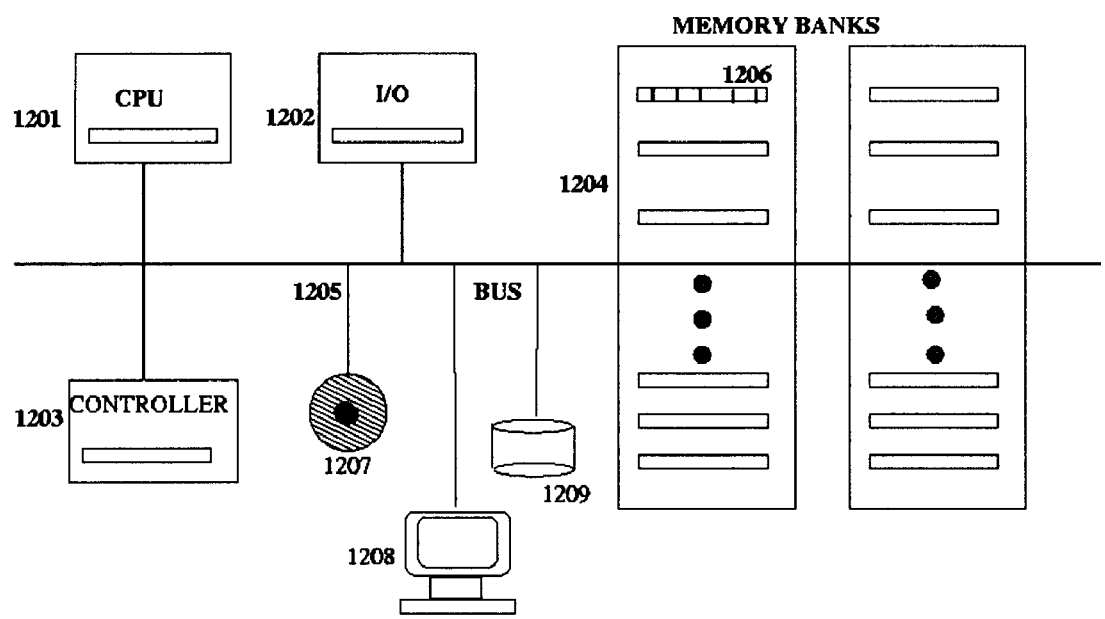
FIG. 12 illustrates a schematic diagram of a digital computer, adapted to perform the method of the present invention.

FIG. 12 shows a digital computer, whose main parts are the following: a central processing unit (CPU) 1201, one or more input/output (I/O) devices 1202 (such as a keyboard, a mouse, a compact disk (CD) drive, etc.), a controller 1203, a display device 1208, a storage device 1209 capable of reading and/or writing computer readable code, and a memory 1206—all of which are connected, for example, by a bus or a communications network (1205). The present invention can be implemented as a computer program product stored on a computer readable medium 1207, such as a tape or CD. The computer program product contains instructions to implement the method according to the present invention on a digital computer as shown in FIG. 12. However, it can also be implemented in a multiplicity of such a digital computer where the items as depicted above may reside in close physical proximity or distributed over a large geographic region and connected by a communications network.

Figure 7:
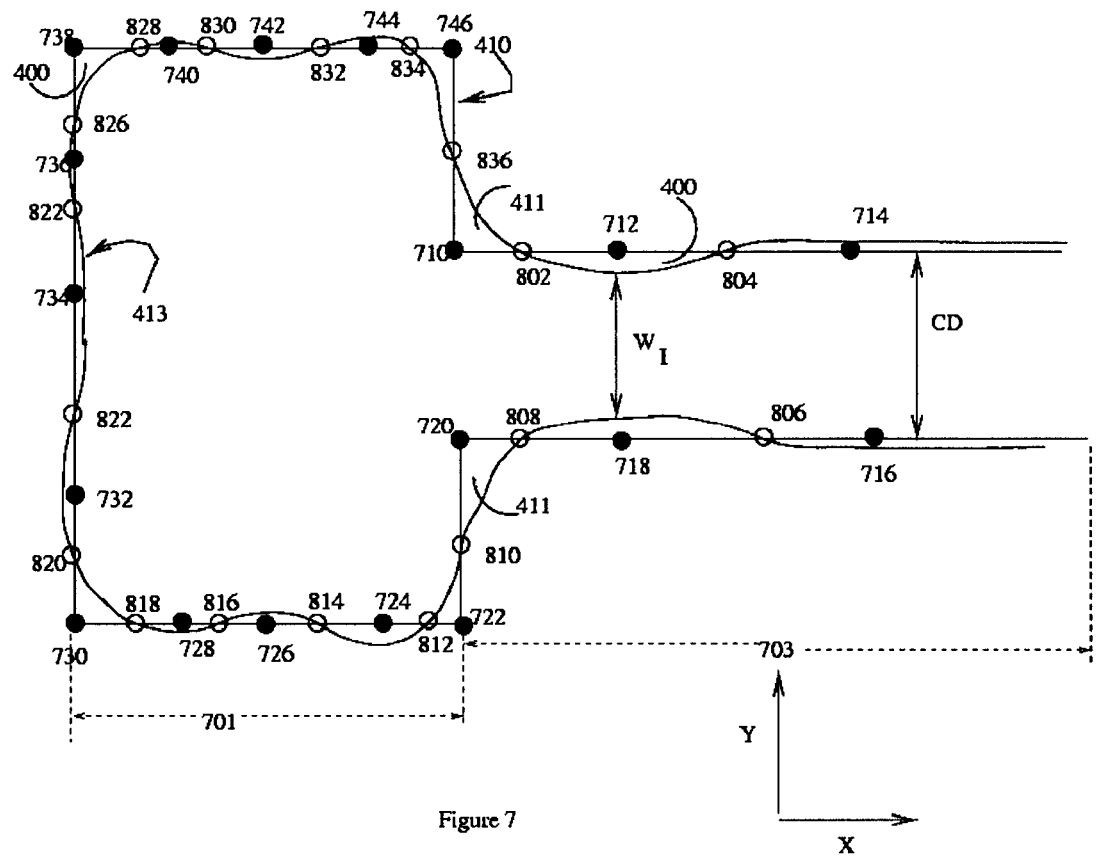
FIG. 7 illustrates a portion of a segmented target image having predetermined evaluation points, and a superimposed corresponding portion of a simulated wafer image at a step of the method in accordance with the present invention.

A preferred embodiment of the adaptive refinement of the present invention can be better understood by reference to FIGS. 7–11. FIG. 7 illustrates a target image 400 having a (straight-edged) threshold boundary 410 including a primary feature having a non-critical portion 701 and a narrower portion 703 having a critical dimension (CD). The edges of the primary target feature 400 are segmented into segments having segment endpoints 710 through 732. Superimposed on the primary target feature 400 is the (curve-edged) boundary 413 of a simulated image 411 resulting from illuminating the primary feature 400. Predetermined evaluation points are selected within each segment of the target boundary (e.g. predetermined evaluation points 802 through 836).

The current invention works in the following manner. Image intensity, gradient and the curvature is computed at each of the pre-selected comparison points (Block 603). If the image parameters (intensity, gradient and/or curvature) had been computed in a previous step and a segment has not gone through the refinement process, these values may be used in this step, without re-computation.

Figure 8:
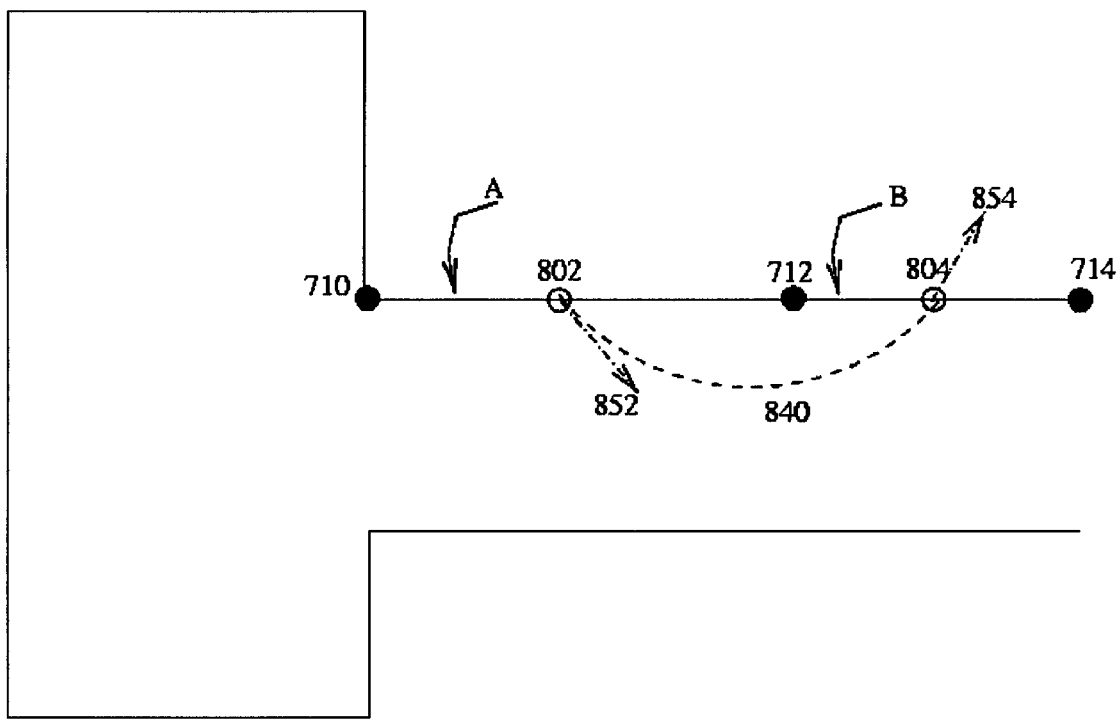
FIG. 8 illustrates a portion of a segmented target image where a curve fit to the wafer image is performed between two predetermined evaluation points in accordance with the present invention.

Referring to FIG. 8, segment A, extending between points 710 and 712 has a pre-selected evaluation point 802, and a segment adjacent to segment A, namely segment B, which extends between points 712 and 714, has a preselected evaluation point 803. The gradient at the preselected points 802, 803 is computed, for example, as discussed above, by using a finite difference approximation to the gradient of equation (1) (e.g. see equation (2)), and curvature of equation (3). Since the values of gradient and curvature are typically computed in current state of the art methods, no additional computation cost is incurred over conventional methods to obtain the gradient and curvature quantities for the present invention.

The image gradient is compared to a gradient tolerance (Block 605). The gradient tolerance value is pre-specified along with the input mask. The gradient tolerance depends on the lithographic process condition and the corresponding technology that is used to manufacture the wafer. If the gradient exceeds the gradient tolerance, then a curve fit to the intensity at the evaluation points on the target image is performed (Block 606). Note that in the case that the gradient is zero, the curvature should be checked (Block 614) to evaluate the case of an optimum or "saddle point" in the image intensity surface. A high curvature value, even when the gradient is zero, will indicate a large deviation of the simulated image from the target image. The curvature tolerance is pre-specified along with the input mask. The curvature tolerance depends on the lithographic process condition and the corresponding technology that is used to manufacture the wafer. For example, for current 193 nm lithographic processes, with numerical aperture about 0.75 and a standard (circular) illumination source, a gradient tolerance of about 6 and a curvature tolerance of about 10 may be appropriate, depending upon the desired tolerance in critical dimension. If both the gradient (and curvature values, if necessary) are less than the gradient tolerance (and curvature tolerance, if necessary), then no further action is needed for that segment, and the next segment is evaluated (Block 604).

If the image gradient is greater than the gradient tolerance, or if the curvature is non-zero and exceeds a curvature tolerance, in accordance with the present invention, the segment will be refined. The first step in a preferred embodiment of the present invention is to estimate the image between the evaluation point of the current segment and an adjacent segment evaluation point based on the existing simulated image at those evaluation points. This estimated image is preferably determined by performing a curve fit using the intensity gradient and curvature (Block 606). At this step, in a preferred embodiment, a Binomial spline (B-spline) curve fit is performed using the information contained in the image intensities, image gradient and the image curvature. Other curve fitting techniques could also be used to implement the present invention. In this description of the invention the curvefitting is used to denote any curve fitting method including but not exclusive of B-spline, polygonal approximation, circular arc, cubic spline and Bezier curve.

An example of curve fitting is shown in FIG. 8. In FIG. 8, a portion of the target image is shown having two segments A (connecting points 710 and 712) and B (connecting points 712 and 714). In this example, the predetermined evaluation points 802 and 804 are at the center points of the two adjacent segments A and B. The arrows 852 and 854 show the directions of the image gradients at the evaluation points 802 and 804 respectively. By using the image intensity values and the gradients at the evaluation points 802, 804, a B-spline curve fit 840 is obtained using techniques known in the art.

Figure 9:
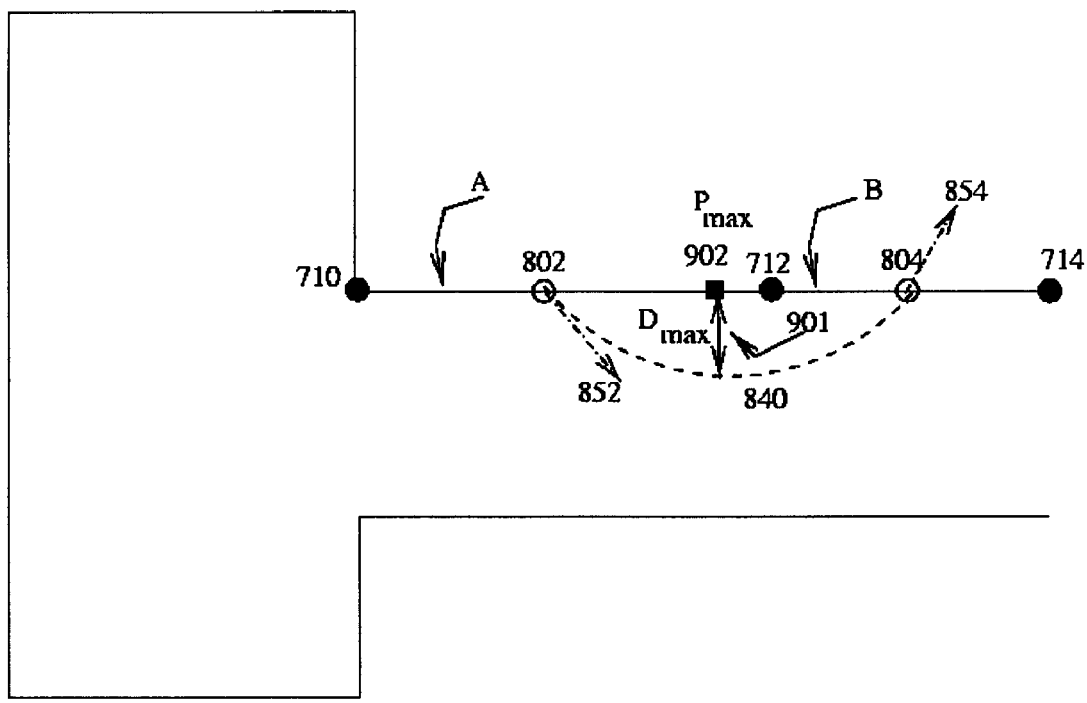
FIG. 9 illustrates the deviation of the fitted curve from the target image in accordance with the present invention.

After the curve is fitted (Block 606), the maximum deviation distance 901 ($D_{max}$) of the curve from the target image is determined (Block 607). The maximum deviation distance 901 is preferably measured orthogonally from the target image. The orthogonal distance is a preferred deviation distance, because it is a very good norm for 45 degree edges and for edges parallel to the coordinate axes. The maximum deviation distance 901 is depicted in FIG. 9. The point on the target image where the maximum deviation 901 occurs is denoted as $P_{max}$.

As depicted in FIG. 6, $D_{max}$ 901 is checked against a predefined deviation tolerance (Block 608). If $D_{max}$ is less than the deviation tolerance, no further action is required for that segment, in this current step, in accordance with the inventive method, and the next segment is considered. The deviation tolerance is defined by the user to obtain a desired accuracy within practical speed requirements (i.e. a speed/accuracy tradeoff). A smaller tolerance value will result in increased refinements leading to more segments causing more evaluations and more iterations. On the other hand a larger tolerance value may not refine any segments making the resulting layout no better than that generated by the current art. A typical deviation tolerance is about 5–10% of the Critical Dimension (CD). For example, for a critical dimension of 100 nm, the deviation tolerance is preferably in the range of 5–10 nm.

If $D_{max}$ is greater than the predefined tolerance for distance, the inventive methodology then generates subsegments (Block 609). The existing adjacent segments are divided so that the point of maximum deviation $P_{max}$ becomes a new evaluation point 902 of a new segment A2. The new segment A2 is created by dividing the segment A in which the point of maximum deviation $P_{max}$ is located, into two sub-segments A1, A2, having new endpoint 1002, which is preferably located so that the new evaluation point 902 (which is coincident with $P_{max}$) is at the center of a new segment A2. A new evaluation point 1102 is also located within the other newly formed subsegment A1, preferably at the center of A1.

Figure 10:
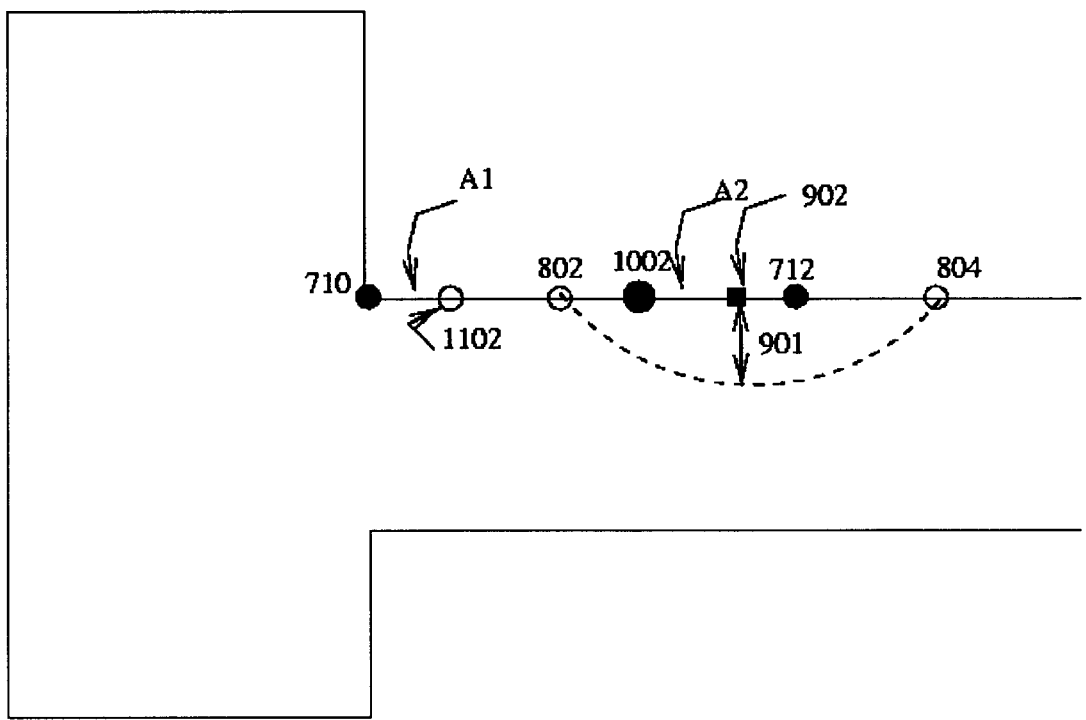
FIGS. 10, 10A, 10B and 10C illustrate segment refinement in accordance with the present invention.
Figure 10A:
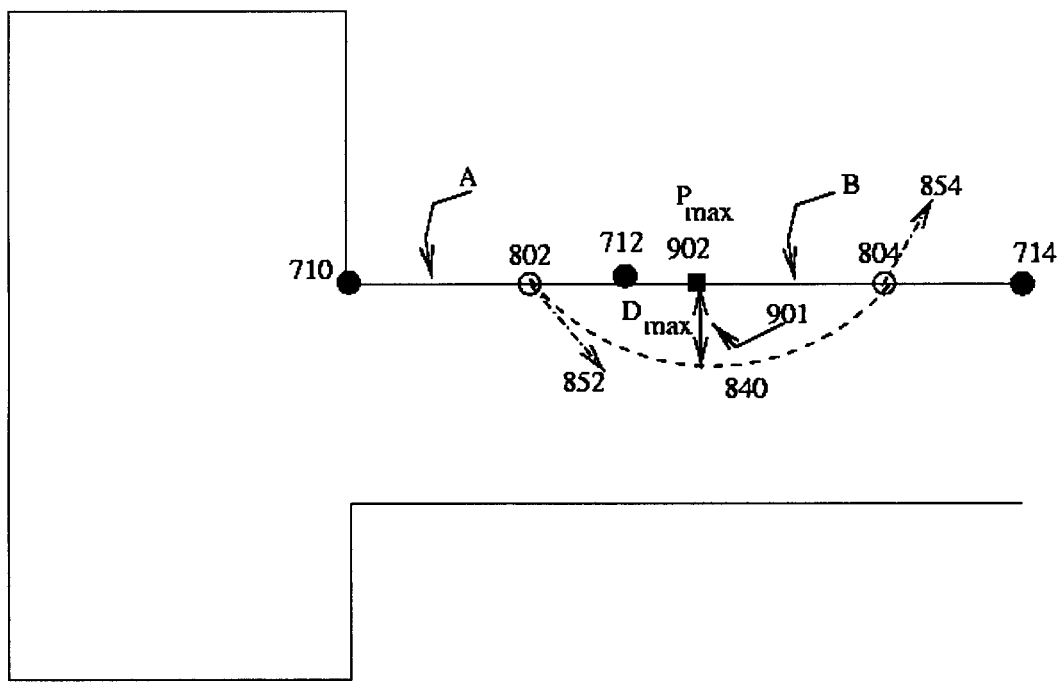
Figure 10B:
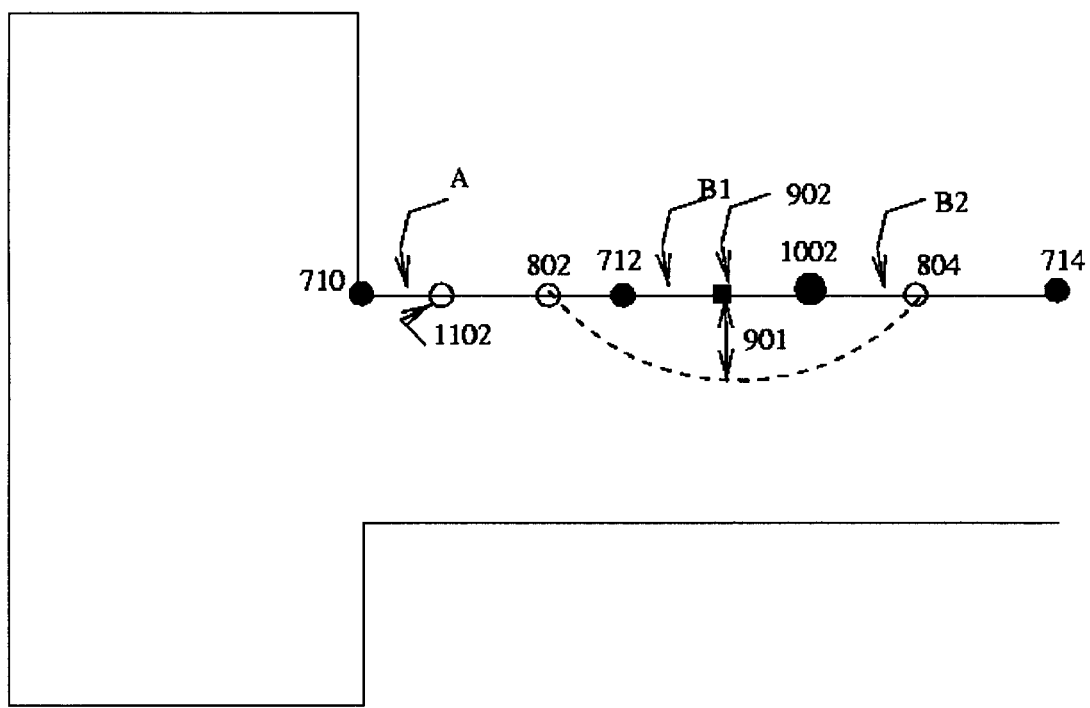

If the point of maximum deviation $P_{max}$ 902 were inside the segment B with endpoints 712 and 714, then segment B needs to be divided, as illustrated in FIG. 1A. The segment B is divided into two segments, viz., B1 and B2. In this case, the new segment endpoint 1002 is so chosen that the point 902 lies at the center of the newly created segment B1, as in FIG. 10B.

Figure 10C:
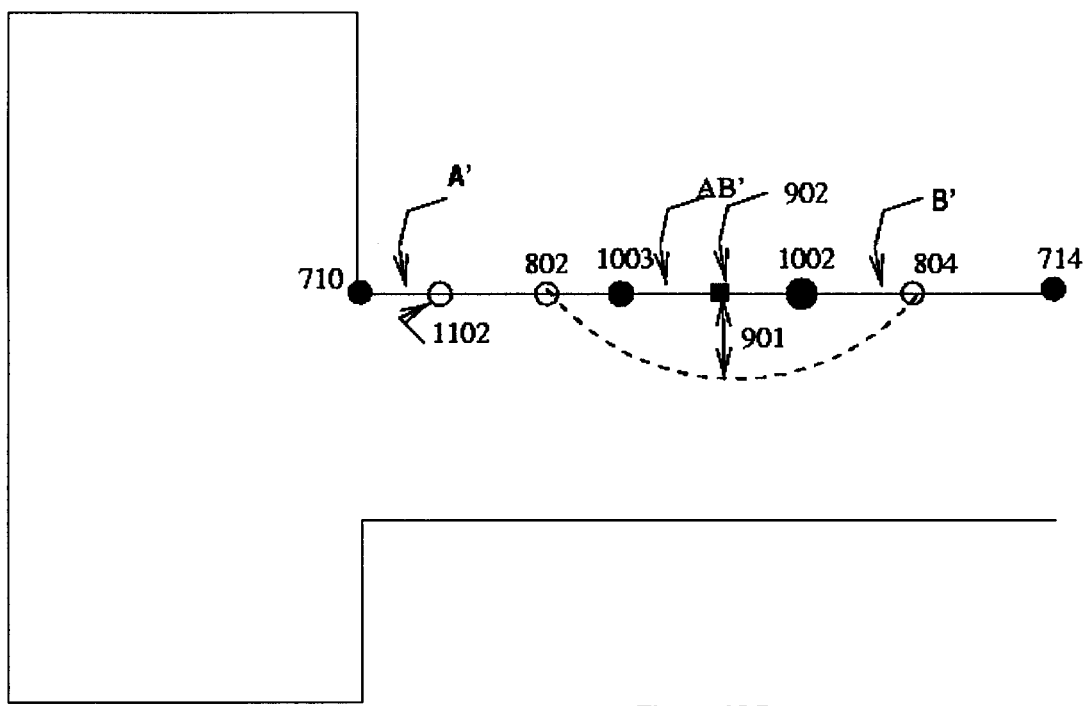
Figure 11:
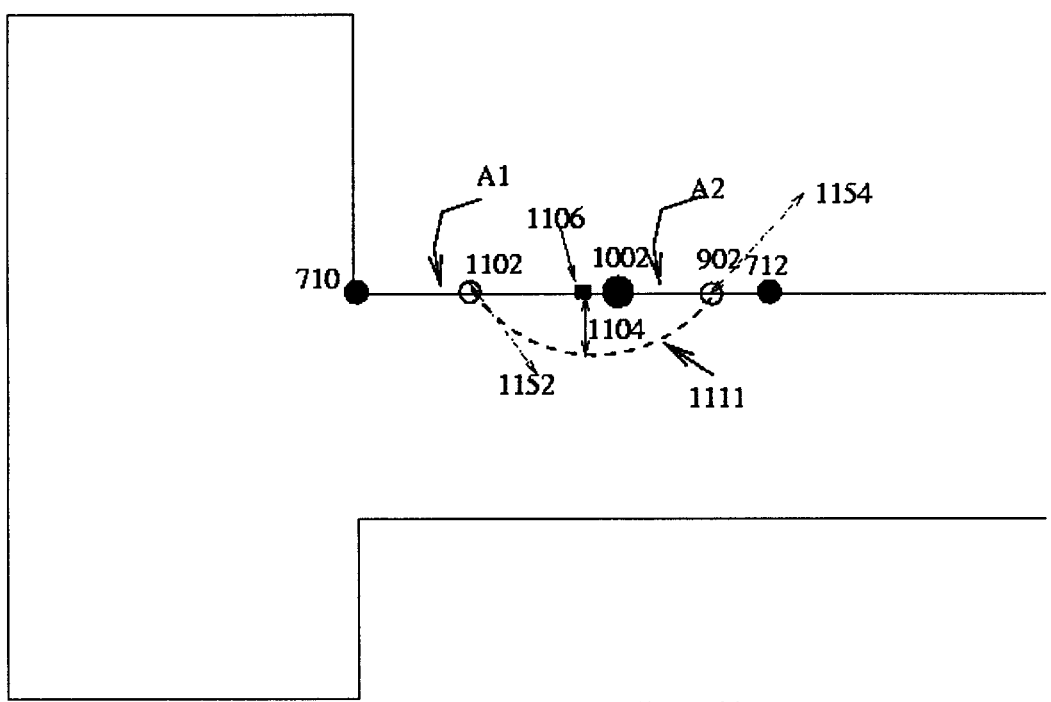
FIG. 11 illustrates a curve fitting performed on a refined subsegment in accordance with the present invention.

In yet some other cases, the point of maximum deviation $P_{max}$ 902 may lie too close to or on the end point 712 dividing the segment A and B. Referring now to FIG. 10C, in this case, refining either segment A or B may create a segment with zero or very small length. Therefore, a new segment is created by taking portions of both segment A and B. In FIG. 10C, the newly created segment AB' has end points 1002 and 1003 and it satisfies the requirement of minimum length for a segment. The point of maximum deviation $P_{max}$ 902 lies at the center of segment AB'. Consequently both segments A' (with endpoints 710 and 1003) and B' (with endpoints 714 and 1002) are created from segments A and B respectively.

Note that in the above described process, it was assumed that each segment is long enough to be refined. If a segment is initially too small or becomes too small in the process of refinement, it may not be refined any further and an error message may be produced warning the user about this problem.

The image intensity is computed at each of the new evaluation points 1102, 902 of the newly created segments (Block 610). If the threshold intensity of the image at the new evaluation point is not within the deviation distance tolerance limit relative to the target image threshold, the newly created segments are moved away or towards the target image for correction (Block 611). The process is then repeated with the new segments A1, A2. At the new evaluation points 1102, 902, new image intensity values, gradients and image curvatures are computed. Then the steps from Block 603 through 611 is repeated until the tolerances are met for all sub-segments of the original segment A being evaluated. For example, in FIG. 11, the gradients 1152, 1154 are obtained for new evaluation points 1102, 902 respectively. The resulting fitted curve 1111 has a maximum deviation distance $D_{max}$ 1104, and a $P_{max}$ located at point 1106. If $D_{max}$ at point 1104 exceeds the deviation tolerance, then the sub-segmentation continues until the specified deviation tolerance is met. The resulting mask layout that is output at the end of the inventive method will have additional segments where needed to improve accuracy, but with only marginal increase in computational effort over conventional MBOPC methods.

Although the present invention and its advantages have been described in detail, it should be understood that various changes, substitutions and alterations can be made herein without departing from the spirit and scope of the invention as defined by the appended claims.

What is claimed is:

1. A method of manufacturing an integrated circuit comprising:
   providing a target design, wherein said target design has an target image shape divided into target segments and each of said target segments has an associated segment evaluation point;
   providing an initial mask shape;

dividing said mask shape into mask segments corresponding to each of said target segments;
determining a simulated image corresponding to each of said associated segment evaluation points, wherein said simulated image is formed in accordance with said mask shape for a lithographic process;
providing a deviation tolerance for a deviation of a simulated image metric from a corresponding target image metric; and
for each of said segment evaluation points, determining a simulated image metric based on said simulated image at said segment evaluation point, and refining the mask segment corresponding to said segment evaluation point if said simulated image metric exceeds said deviation tolerance.

2. The method of claim 1, wherein said deviation tolerance comprises a maximum distance of a threshold intensity contour of a simulated image from a threshold intensity contour of a target image.

3. The method of claim 1, wherein said step of determining a simulated image metric further comprises determining an estimated image based on said simulated image corresponding to said segment evaluation points.

4. The method of claim 3, further comprising determining said estimated image by a curve fit based on said simulated image corresponding to said segment evaluation points.

5. The method of claim 4 wherein said curve fit is performed by a method selected from the group consisting of Binomial spline, polygonal approximation, circular arc, cubic spline and Bezier curve.

6. The method of claim 1 further comprising the step of determining a simulated image further comprises determining an image intensity, a gradient and curvature of said simulated image intensity corresponding to said segment evaluation point.

7. The method of claim 6 further comprising:
providing a gradient tolerance and a curvature tolerance; and
testing said gradient, and
if said gradient is not equal to zero and is less than or equal to said gradient tolerance, or if said gradient is equal to zero and said curvature is less than or equal to said curvature tolerance, then skipping said step of refining the mask segment.

8. The method of claim 6 further comprising:
providing a gradient tolerance and a curvature tolerance; and
testing said gradient, and
if said gradient is not equal to zero and is greater than said gradient tolerance, or if said gradient is equal to zero and said curvature is greater than said curvature tolerance, then determining an estimated image based on said simulated image corresponding to said segment evaluation point.

9. The method of claim 8, wherein said determining an estimated image further comprises a curve fit based on said simulated image corresponding to said segment evaluation points.

10. The method of claim 9, wherein said curve fit is performed by a method selected from the group consisting of Binomial spline, polygonal approximation, circular arc, cubic spline and Bezier curve.

11. A computer program product comprising:
a machine readable medium having machine readable program code means embodied therein, the computer readable program code means comprising instructions executable by the machine to perform methods steps for designing a lithographic mask, said method steps comprising:
storing a target design, wherein said target design has an target image shape divided into target segments and each of said target segments has an associated segment evaluation point;
storing an initial mask shape;
dividing said mask shape into mask segments corresponding to each of said target segments;
determining a simulated image corresponding to each of said associated segment evaluation points, wherein said simulated image is formed in accordance with said mask shape for a lithographic process;
storing a deviation tolerance for a deviation of a simulated image metric from a corresponding target image metric; and
for each of said segment evaluation points, determining a simulated image metric based on said simulated image at said segment evaluation point, and refining the mask segment corresponding to said segment evaluation point if said simulated image metric exceeds said deviation tolerance.

12. The computer program product of claim 11, wherein said deviation tolerance comprises a maximum distance of a threshold intensity contour of a simulated image from a threshold intensity contour of a target image.

13. The computer program product of claim 11, wherein said step of determining a simulated image metric further comprises determining an estimated image based on said simulated image corresponding to said segment evaluation points.

14. The computer program product of claim 13, further comprising determining said estimated image by a curve fit based on said simulated image corresponding to said segment evaluation points.

15. The computer program product of claim 14 wherein said curve fit is performed by a method selected from the group consisting of Binomial spline, polygonal approximation, circular arc, cubic spline and Bezier curve.

16. The computer program product of claim 11 further comprising the step of determining a simulated image further comprises determining an image intensity, a gradient and curvature of said simulated image intensity corresponding to said segment evaluation point.

17. The computer program product of claim 16 further comprising:
storing a gradient tolerance and a curvature tolerance; and
testing said gradient, and
if said gradient is not equal to zero and is less than or equal to said gradient tolerance, or if said gradient is equal to zero and said curvature is less than or equal to said curvature tolerance, then skipping said step of refining the mask segment.

18. The computer program product of claim 16 further comprising:
storing a gradient tolerance and a curvature tolerance; and
testing said gradient, and
if said gradient is not equal to zero and is greater than said gradient tolerance, or if said gradient is equal to zero and said curvature is greater than said curvature tolerance, then determining an estimated image based on said simulated image corresponding to said segment evaluation point.

19. The computer program product of claim 18, wherein said determining an estimated image further comprises a curve fit based on said simulated image corresponding to said segment evaluation points.

20. The computer program product of claim 19, wherein said curve fit is performed by a method selected from the group consisting of Binomial spline, polygonal approximation, circular arc, cubic spline and Bezier curve.

* * * * *